(12) United States Patent
Sikkink

(10) Patent No.: US 6,496,048 B1
(45) Date of Patent: Dec. 17, 2002

(54) SYSTEM AND METHOD FOR ACCURATE ADJUSTMENT OF DISCRETE INTEGRATED CIRCUIT DELAY LINES

(75) Inventor: Mark Ronald Sikkink, Chippewa Falls, WI (US)

(73) Assignee: Silicon Graphics, Inc., Mountain View, CA (US)

(*) Notice: Subject to any disclaimer, the term of this patent is extended or adjusted under 35 U.S.C. 154(b) by 0 days.

(21) Appl. No.: 09/620,683

(22) Filed: Jul. 20, 2000

(51) Int. Cl.[7] .............................................. H03H 11/26
(52) U.S. Cl. ........................................ 327/277; 327/271
(58) Field of Search ................................. 327/271, 277, 327/273, 279, 284, 286, 265, 276, 269, 153, 161, 158

(56) References Cited

U.S. PATENT DOCUMENTS

| | | | |
|---|---|---|---|
| 4,514,749 A | 4/1985 | Shoji ............................. | 357/68 |
| 4,637,018 A | 1/1987 | Flora et al. ..................... | 371/1 |
| 4,696,019 A | 9/1987 | Tulpule et al. ............... | 375/107 |
| 4,755,704 A | 7/1988 | Flora et al. .................. | 307/269 |
| 4,805,195 A | 2/1989 | Keegan ....................... | 375/106 |
| 4,833,695 A | 5/1989 | Greub ......................... | 375/118 |
| 4,845,390 A | 7/1989 | Chan .......................... | 307/602 |
| 4,860,322 A | 8/1989 | Lloyd .......................... | 375/107 |
| 4,922,141 A * | 5/1990 | Lofgren et al. .............. | 327/158 |
| 4,926,066 A | 5/1990 | Maini et al. ............... | 307/303.1 |
| 4,959,540 A | 9/1990 | Fan et al. ............... | 250/227.12 |
| 5,087,829 A | 2/1992 | Ishibashi et al. ............ | 307/269 |
| 5,220,206 A * | 6/1993 | Tsang et al. ................ | 327/269 |
| 5,329,188 A | 7/1994 | Sikkink et al. ............. | 307/517 |
| 6,043,717 A * | 3/2000 | Kurd .......................... | 327/158 |
| 6,172,546 B1 * | 1/2001 | Liu et al. .................... | 327/265 |
| 6,204,705 B1 * | 3/2001 | Lin ............................. | 327/276 |

* cited by examiner

Primary Examiner—Timothy P. Callahan
Assistant Examiner—Linh Nguyen
(74) Attorney, Agent, or Firm—Schwegman, Lundberg, Woessner & Kluth P.A.

(57) ABSTRACT

A system and method of controlling delay in a delay line. In a delay line having a system mode and an oscillator mode, wherein the delay line delays a signal as a function of a delay code, the method comprises setting the delay code, placing the delay line in oscillator mode, determining frequency of oscillation of the delay line, comparing the frequency of oscillation to a target frequency and adjusting the delay code until the frequency of oscillation of the delay line is substantially equal to the target frequency.

13 Claims, 5 Drawing Sheets

SYSTEM AND METHOD FOR ACCURATE ADJUSTMENT OF DISCRETE INTEGRATED CIRCUIT DELAY LINES

FIELD OF THE INVENTION

The present invention is related to delay lines, and more particularly to a system and method for controlling the amount of delay over a range of delays and operating conditions.

BACKGROUND INFORMATION

Delay lines serve a variety of functions within digital systems. They can be used, for instance, to deskew a clock or to change the phase of a clock or of a signal.

To date, a variety of approaches have been used to add delay to a signal. Delay has been implemented using delay lines external to the integrated circuit. Such an approach, however, consumes pins and real estate both on the integrated circuit and on the circuit board.

Conventional Delay Locked Loops (DLLs) have also been used. DLLs, however, limit flexibility. That is, only a limited number of delay choices can be provided and at a rather coarse granularity. Furthermore, the choices must be determined at design time.

Discrete delay lines have also been implemented directly on the integrated circuit. Under such an approach, standard cell or other ASIC technology is used to implement the delay line. The integrated circuit approach to discrete delay lines is advantageous in that regular ASIC design and verification tools can be used to design and test the delay line. Delay lines designed using this approach, however, can exhibit variation in delay as the operating environment (e.g., temperature, voltage level, etc.) changes. In addition, since the delay line is implemented directly on an integrated circuit, it can exhibit changes in delay due to variations in the integrated circuit manufacturing process.

Delay within a discrete delay line varies with environmental factors such as temperature, voltage and process. In the past, maintaining a consistent delay across temperature and voltage has been difficult. DLLs avoid this problem but at the cost described above.

What is needed is a discrete delay line control system and method that uses regular ASIC design and verification tools but which can be controlled to limit variations due to process, temperature, voltage level and other operating parameters. In addition, what is needed is a delay control process that is capable of managing discrete delay lines with a wide delay range and which is capable of automatically obtaining any delay value within the delay line range. Finally, what is needed is a method of controlling a delay line which can measure and adjust delay accurately, and continue to monitor performance after the initial setting.

SUMMARY OF THE INVENTION

According to one aspect of the present invention, a system and method of controlling delay in a delay line is described. In a delay line having a system mode and an oscillator mode, wherein the delay line delays a signal as a function of a delay code, the method comprises setting the delay code, placing the delay line in oscillator mode, determining frequency of oscillation of the delay line, comparing the frequency of oscillation to a target frequency and adjusting the delay code until the frequency of oscillation of the delay line is substantially equal to the target frequency.

According to another aspect of the present invention, a system and method of controlling delay in a signal delay line having an input and an output is described. The signal delay line delays signals as a function of a delay code. A replicate delay line having an input and an output is provided, wherein the replicate delay line delays signals as a function of a delay code. The output of the signal delay line is fed back to its input to form an oscillator having an oscillation frequency. The oscillation frequency of the signal delay line is determined and compared to a target frequency. The delay code of the signal delay line is then adjusted until the frequency of oscillation of the signal delay line is substantially equal to the target frequency. The replicate delay line is driven with the delay code of the signal delay line and the output of the replicate delay line is fed back to its input to form an oscillator having an oscillation frequency. The oscillation frequency of the replicate delay line is determined and the delay code of the replicate and signal delay lines is adjusted as a function of changes in the oscillation frequency of the replicate delay line.

According to yet another aspect of the present invention, a delay line includes a master delay line, a slave delay line, and a delay line controller connected to the master delay line and the slave delay line. The master delay line sets delay as a function of a delay code. In addition, the master delay line includes an oscillator mode having an oscillation frequency which is a function of delay in the master delay line. The slave delay line sets delay as a function of a delay code. In addition, the slave delay line includes an oscillator mode having an oscillation frequency which is a function of delay in the slave delay line. The delay line controller includes a frequency counter and a state machine, wherein the frequency counter determines the oscillation frequencies of the master and slave delay lines when the master and slave delay lines are in oscillator mode and wherein the state machine adjusts the delay code to both the master and slave delay lines as a function of the oscillation frequencies of the master and slave delay lines.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be: utilized and structural changes may be made without departing from the scope of the present invention.

As noted above, delay within a discrete delay line varies with environmental factors such as temperature, voltage and process. In the past, maintaining a consistent delay across temperature and voltage has been difficult. A discrete delay line system 10 which can be controlled to limit variations due to process, temperature, voltage level and other operating parameters is shown in FIG. 1.

Figure 1:
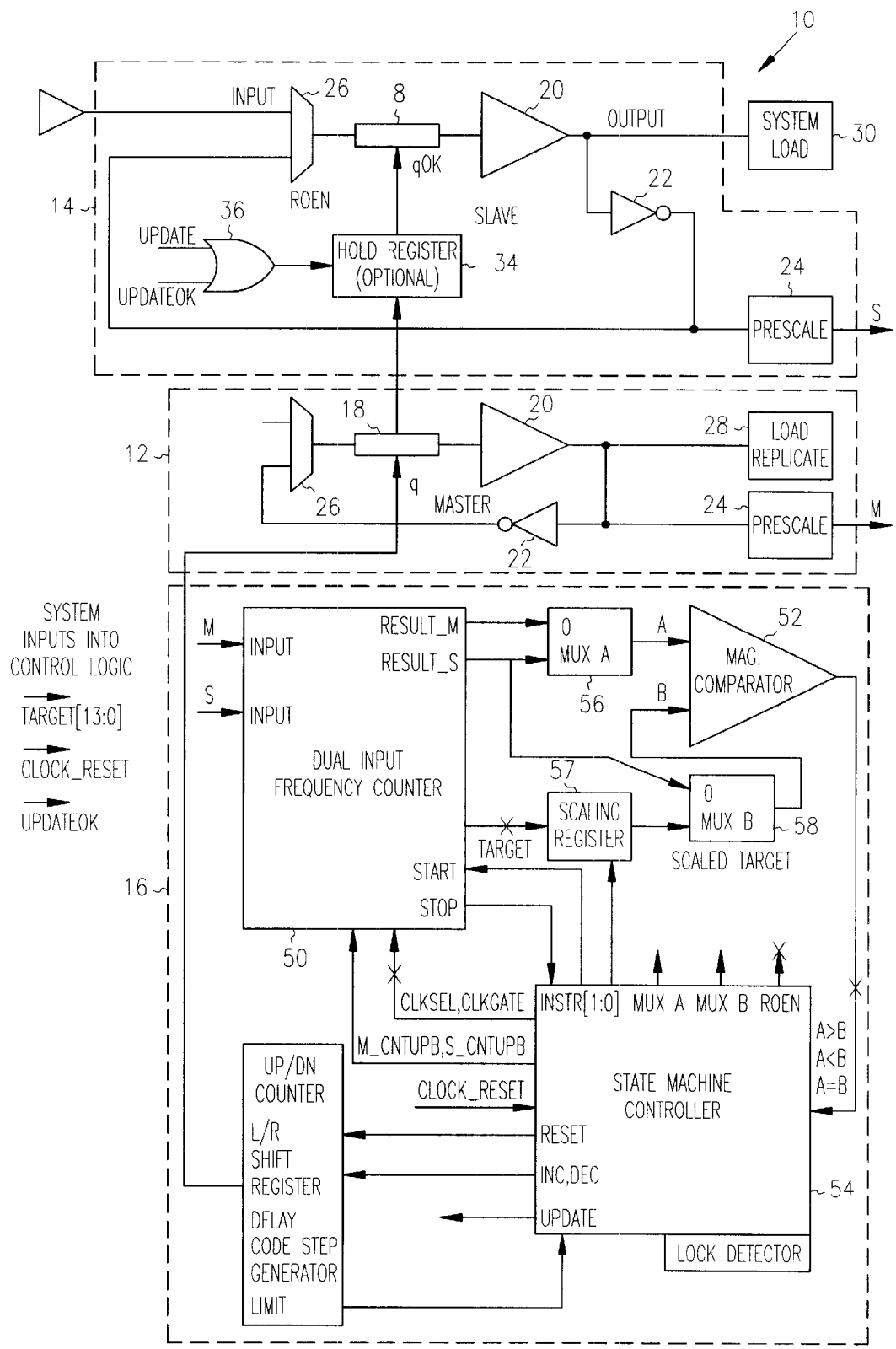
FIG. 1 illustrates a discrete delay line system.

System 10 in FIG. 1 includes a master delay, line circuit 12, a slave delay line circuit 14 and a delay controller 16. Each delay line circuit (12, 14) includes a delay line 18, a driver 20, an inverter 22 and a 2:1 multiplexer 26. In addition, master delay circuit 12 includes a load replicate 28 designed to simulate the system load 30 seen by slave delay line circuit 14.

In one embodiment, discrete delay line 18 is controlled directly with a digital delay code 32 (in which case an inherent Digital-to. Analog Converter(DAC) is implied), providing a fixed number of discrete delays corresponding to each possible decoded value of the digital code.

Another embodiment uses linear delay lines, which inherently have an infinite number of delays, under the control of a continuous analog level. If this control is formed at the output of a DAC, then the discrete step model is forced upon this delay line, as well.

Changes in delay code 32 that represent the minimum delay step define the granularity or resolution of delay line system 10 (also referred to as the Least Significant Bit step size). The delay range is the difference between the maximum and minimum delays.

By placing multiplexor 26 in front of delay line 18, two operating modes are defined; 1) System (open loop) 2) Adjust (closed loop). With inverter 22 is in the feedback path, closed loop mode forms a free running ring oscillator. The oscillation frequency/period in closed loop mode is directly correlated to the system delay. In the embodiment shown, the oscillation period is equal to twice the system 10 delay.

If, while in closed loop mode, the oscillation frequency is measured and adjusted repeatedly, then an absolute predetermined oscillation frequency is obtained. By correlation, an absolute predetermined system delay exists in open loop mode (with the only error being the small inversion delay).

In one embodiment, delay line circuit 12 is, in effect, a replicate delay system, which is physically smaller than circuit 14 and which is non-functional, but which also matches the delay characteristics of the original. The replicate delay system is operated in the closed loop mode only.

Delay line 18 in the replicate delay system. 12 receives the same delay code as system delay line 18 in circuit 14. In one embodiment, the oscillation period of replicate delay system 12 is continuously measured. If the oscillation period of replicate delay system 12 wanders outside preset limits then the delay line code is incremented or decremented to correct the error. Both the replicate and system delays are corrected, providing a means for tracking slow variances in system parameters, such as temperature and voltage.

In the embodiment shown in FIG. 1, master and slave delay line circuits 12 and 14 have programmable discrete delay lines 18 as a segment of their delay paths. The binary delay code 32 presented to each delay line 18 is identical, except for an optional register 34 delay to the slave.

In the embodiment shown in FIG. 1, delay controller 16 provides control for both the master delay line circuit 12 and slave delay line circuit 14. The slave delay represents the functional delay path that needs critical control. The master delay is an electrical (not functional) copy, modeling the same delay characteristics. The slave delay path can be operated open loop (system mode) or closed loop (ring oscillator mode). The master delay is always operated closed loop.

Figure 2:
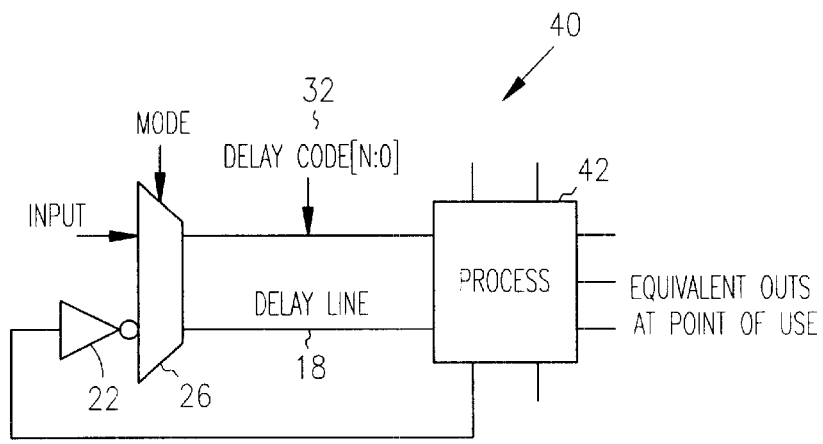
FIG. 2 illustrates a delay line which can be used in the delay line system of FIG. 1.

In one embodiment, each delay line 18 is capable of operating alone or as a segment of a longer process. An example of a delay line 18 as part of another process is shown in FIG. 2. In FIG. 2, delay line system 40 includes a delay line 18, a process 42, an inverter 22 and a multiplexer 26. Process 42 may be as simple as a fanout tree, where several identical copies are created, all equally delayed. Delay line 18, inverter 22, multiplexer 26. and downstream process 42 together form a complete process delay system 40. In such an embodiment, the overall delay of process delay system 40 can be controlled simply by adjusting the delay line.

In one embodiment, the control algorithm starts with the slave delay in ring oscillator mode. The oscillation frequency of the slave loop is proportional to the delay through delay line circuit 12 (with the exception of the inversion delay) and can be measured directly with a frequency counter. The result (which is directly related to the slave delay) is compared to a desired outcome (target). The slave delay is incremented or decremented, as required, and then the adjusted loop delay is recounted. This process continues until the slave delay reaches the desired value (target).

The master delay is counted simultaneously with the slave. After the slave reaches the desired value the slave count and master count are compared. The target is scaled by plus or minus (master count–slave count). This new target value is now used to monitor and adjust the master delay over time. Any first order differences between the master and slave delays are canceled by scaling the target. The master delay and, therefore, the slave delay, can now be adjusted over time to compensate for temperature, voltage, or other environmental factors.

In one embodiment, the oscillation of master delay circuit 12 is monitored continuously. If the oscillation frequency wanders outside predefined limits, then the delay code is changed to correct the delay. The slave delay is modified with the same delay code the next time that it is inactive.

In one embodiment, a hold register 34 stores the delay code to the slave. Hold register 34 includes an OR gate 36 which prevents delay updates to the system path when delay circuit 14 is busy. System 10 activates an updateOK signal, which enables the register and allows a slave delay update, when the path is idle. This prevents delay glitches from corrupting critically timed signals.

Master/slave (replicate/system) delays combined with frequency counters and unique control form a method by which very accurate absolute delays can be established and maintained. Although the replicate may not necessarily be a good absolute delay match, they should track on substantially the same 'slope as system parameters change.

One embodiment of delay controller 16 will be discussed next. A delay controller 16 is shown in FIG. 1. Delay controller 16 in FIG. 1 includes a frequency counter 50, a magnitude comparator 52 and a state machine controller 54. Frequency counter 50 measures the frequency of oscillation of circuits 12 and 14. In one embodiment, circuits 12 and 14 include a prescaler 24 used to divide down the frequency to one more easily handled by frequency counter 50. In one such embodiment, a divide down of two is adequate to simplify the design of frequency counter 50.

Figure 3:
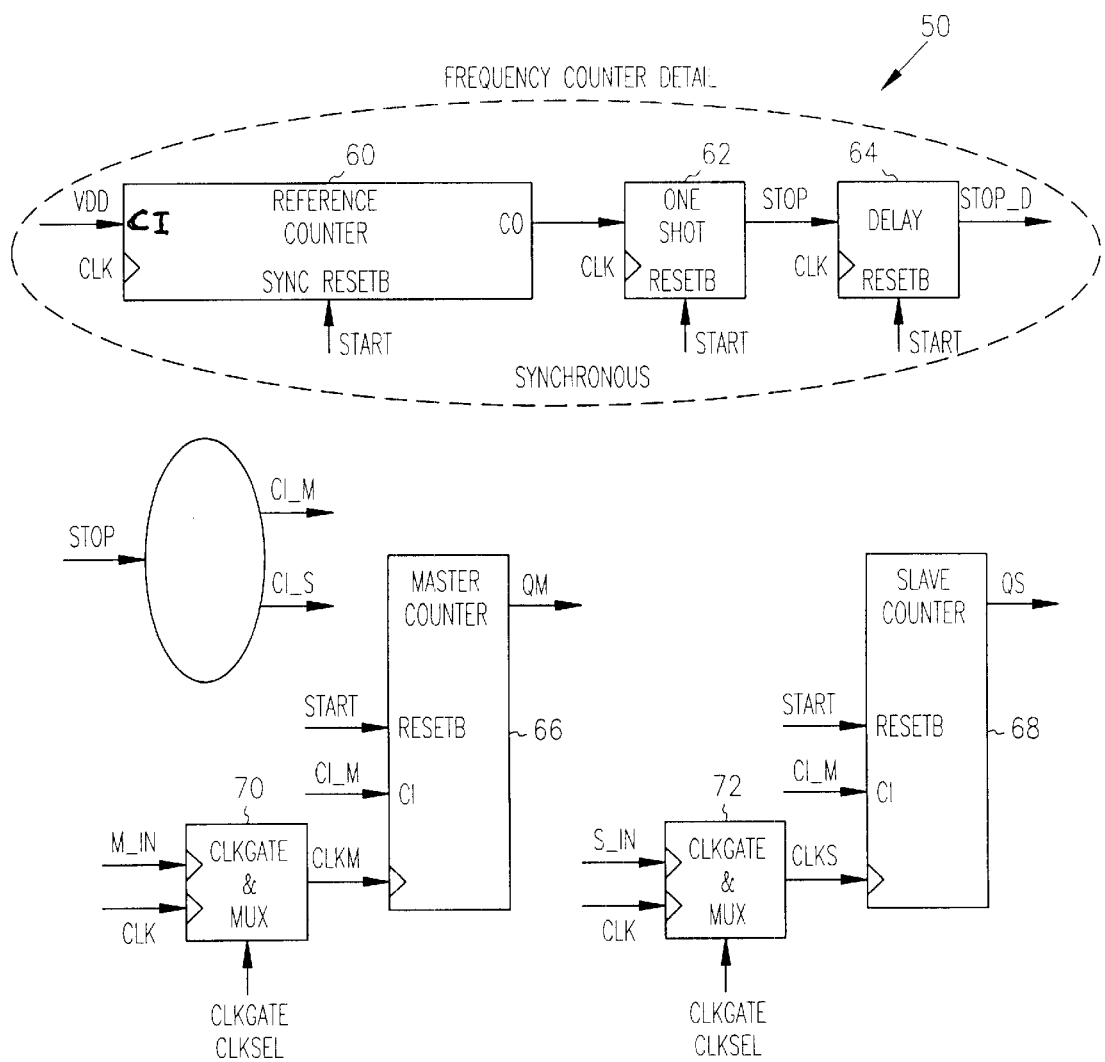
FIG. 3 illustrates a delay line controller which can be used in the delay line system of FIG. 1.

In one embodiment, both the master and the slave frequencies are fed into frequency counter 50; both frequencies are counted at the same time. So, controller 16 is always measuring both frequencies. An example of frequency counter 50 is shown in FIG. 3, where the frequency counter includes a reference counter 60, a master counter 66 and a slave counter 68. Reference counter 60 is connected to a one shot 62 and a delay line 64. One shot 62 generates a "stop" signal to controller 54 as a function of signal"co" from reference counter 60. Counters 66 and 68 are clocked by the output of clock gate/multiplexers 70 and 72, respectively.

In one embodiment, such as is shown in FIG. 3, system clock (clk) serves as the reference clock for frequency counter 50. Clk establishes a time base and that establishes an exact interval time over which controller 16 counts frequency.

Figure 4:
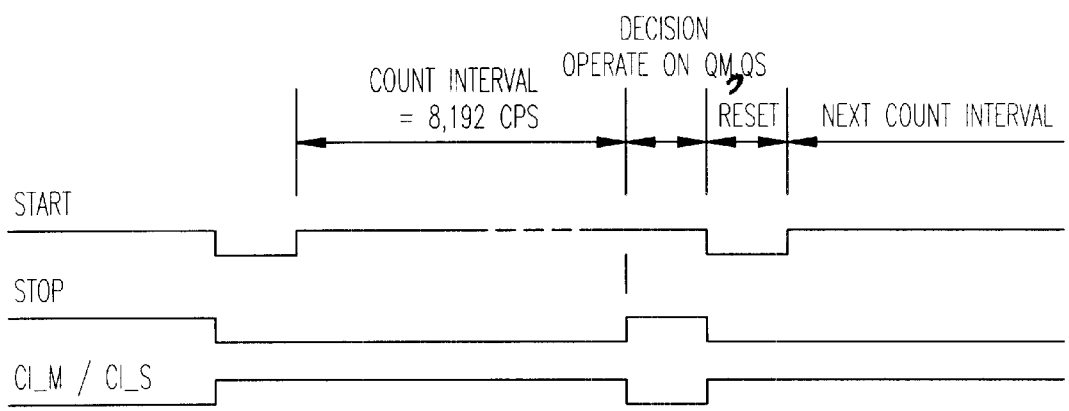
FIG. 4 shows a timing diagram representative of the operation of a frequency counter which can be used in the delay line controller of FIG. 3.

A timing diagram representative of the operation of frequency counter 50 of FIG. 3 is shown in FIG. 4.

Figure 5:
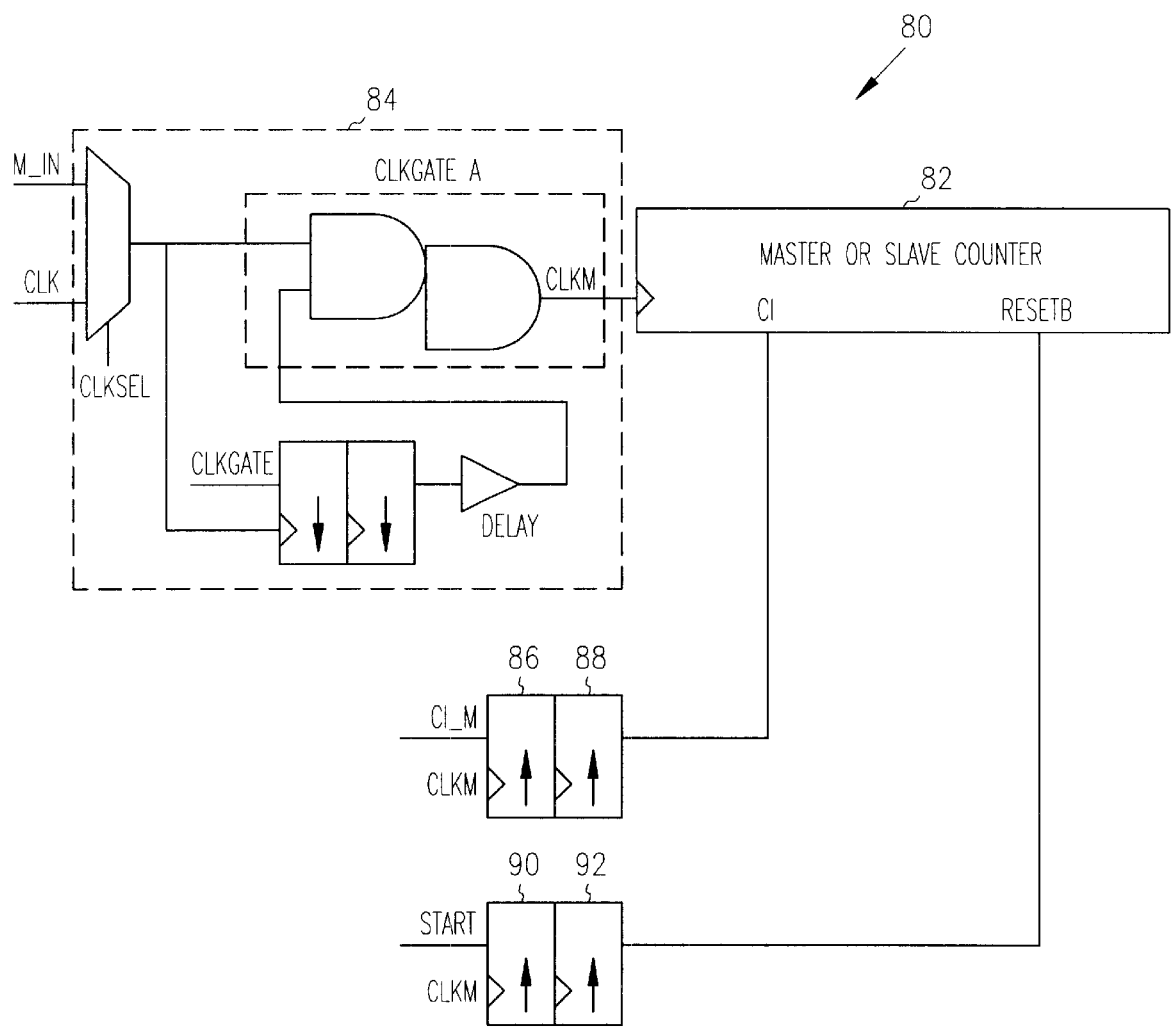
FIG. 5 illustrates one embodiment of a frequency counter which can be used in the delay line controller of FIG. 3.

A counter 80 which can be used as master counter 66 or slave counter 68 is shown in FIG. 5. Counter 80 includes counter 82; clock circuit 84 and registers 86, 88, 90 and 92. In FIG. 5, counter 82 and registers 86, 88, 90 and 92 are clocked by clock circuit 84. Operation of counter 80 will be apparent from the discussion of controller 54 below.

In the embodiment of controller 16 shown in FIG. 1, multiplexer 56 selects between the result of master delay line circuit 12 and slave delay line circuit 14. Multiplexer 58 selects between the target and the result of circuit 14. The output of multiplexers 56 and 58 are fed to magnitude comparator 52, where they are compared and a decision is made by controller 54 whether to increment or decrement the delay code based on the difference between the outputs of multiplexer 56 and multiplexer 58.

In one embodiment, controller .16 includes a state machine controller 54 that controls tracking of the delay. At the start, when controller 54 is done counting, it looks at the slave result, compares that result to a target and either increments or decrements the delay code. The process is repeated until the target delay is reached or until controller 54 determines that the system is oscillating around the target value. The slave loop is then opened up and the system is ready to run. From that point, controller 54 monitors the master and adjusts the delays codes as discussed above.

Figure 6:
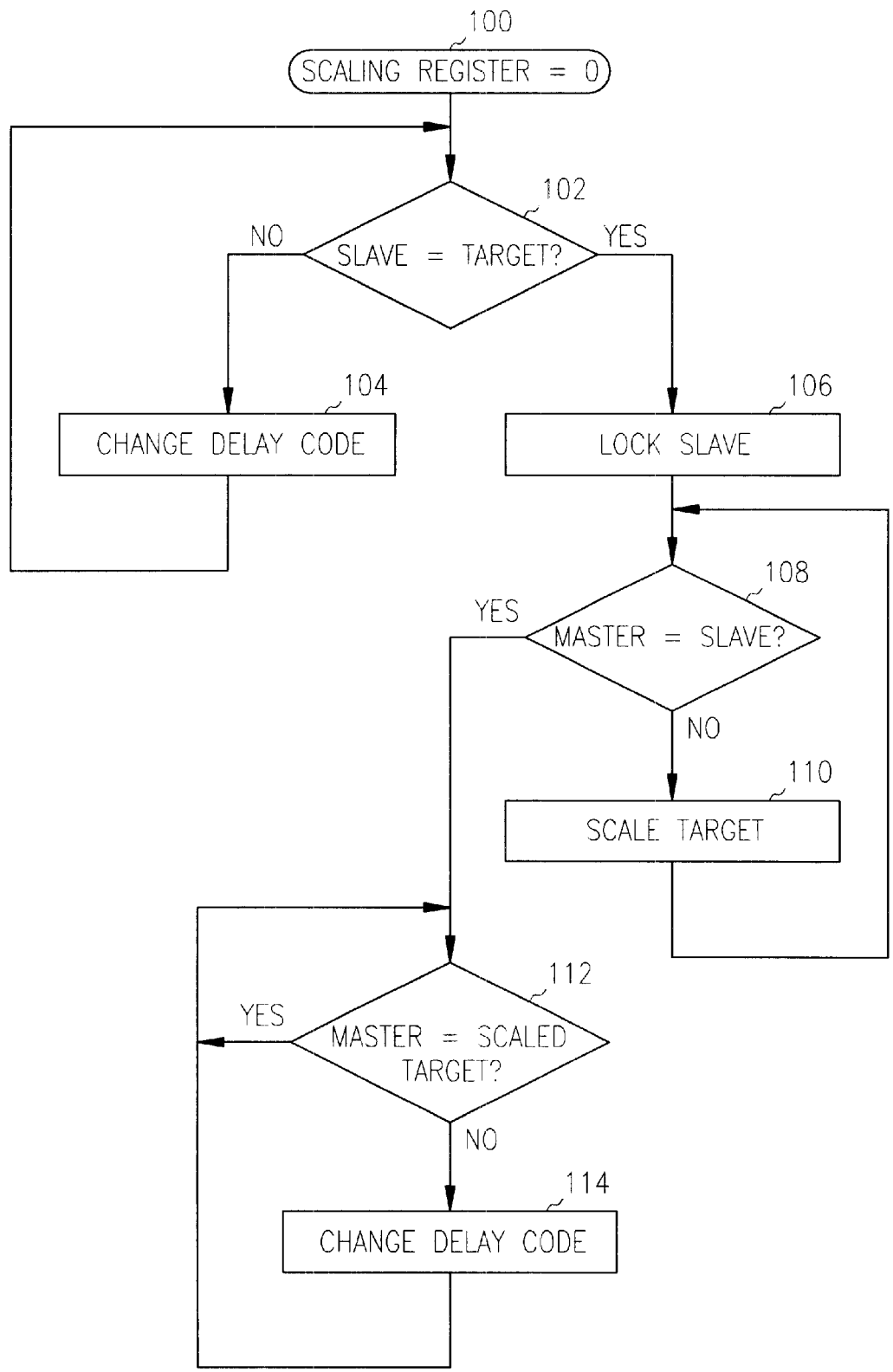
FIG. 6 illustrates a state sequence which can be used in the delay line controller of FIG. 3.

One embodiment of a state sequence that controller 54 may go through in setting delay and tracking drift is shown in FIG. 6. In FIG. 6, controller 54 starts at 100 by setting a scaling register to zero. Control moves to 102, where the target value is compared to the slave result. If the target value is greater than or less than the slave result, control moves to 104, and the delay code is incremented or decremented as a function of the difference. Control then moves to 102 where the target value is compared to the new slave result.

If the target value is equal to the slave result at 102, control moves to 106, and the delay code to the master and the slave is locked. Control then moves to 108, where the master result is compared to the slave result. If the master result is different than the slave result, control moves to 110 and scaling register 57 is incremented or decremented as a function of the difference. Control then returns to 108 and the process continues until the value in scaling register 57 is equal to the difference between the master result and the slave result. The contents of scaling register 57 are then used to scale the target for future comparisons to the master result.

Control then moves on to 112, where the master result is compared to the scaled target. If the master result is different than the scaled target, control moves to 114 and the delay codes to slave circuit 14 and master circuit 12 are incremented or decremented to bring the two values back in line. Control then moves to 112.

In one embodiment, only single delay line circuit (similar to slave delay line circuit 14) is used. Delay line controller 16 periodically places the circuit in oscillation mode and adjusts the delay to account for drift. Such an approach eliminates the requirement for replicate logic such as delay line circuit 12.

Conclusion

The delay controller as described above allows a broad range of delays to be targeted. The range is only limited by the range of the counter (design parameter that establishes smallest and largest countable delays) and by the resolution of the discrete delay line delta. Frequency counters provide extremely accurate measurements with pico-second resolution. Any discrete delay line, including those with pico-second granularity can be managed.

The controller is capable of controlling delay lines in applications where wide delay ranges are required. This capability can be used to create, e.g., a 90 degree phase shift on strobes to and from memory and is flexible enough to be control this phase shift over an octave (100 to 200 Mhz).

Delay line controller 10 also allows for "in-environment" delay adjustments to any value within the range of the delay line being controlled. This can be used to advantage during prototyping or field testing.

Furthermore, this approach permits a migratory upgrade path (control for a wide arbitrary delay range) and immediate, in-situ performance optimization, without the requirement of expensive IC redesigns.

The controller can be implemented in standard cell technology at system clock rates, thus integrating the design into the standard IC design process. If the closed loop oscillation exceeds the system clock rate, then a prescaler conditions the signal prior to forwarding it to the controller. This limits the extent of "high frequency design" to the relatively simple prescaler piece. No design intensive custom cells with analog functions, such as, phase comparators and integrators are required.

Since controller 10 can be constructed using standard logic gates and design methodologies, the controller can be implemented in large ASIC devices, where reduced design cycle times improve "time to market" concerns. Since the design is digital in nature, mixed-signal problems (i.e., noise) that arise-when analog and logic functions reside on the same IC are avoided.

In the above discussion and in the attached appendices, the term "computer" is defined to include any digital or analog data processing unit. Examples include any personal computer, workstation, set top box, mainframe, server, supercomputer, laptop or personal digital assistant capable of embodying the inventions described herein.

Examples of articles comprising computer readable media are floppy disks, hard drives, CD-ROM or DVD media or any other read-write or read-only memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of controlling delay in a delay line having a system mode and an oscillator mode, wherein the delay line delays a signal as a function of a delay code, the method comprising:

setting the delay code;

placing the delay line in oscillator mode;

determining frequency of oscillation of the delay line;

comparing the frequency of oscillation to a target frequency; and adjusting the delay code until the frequency of oscillation of the delay line is substantially equal to the target frequency.

2. The method according to claim 1, wherein determining frequency of oscillation of the delay line includes monitoring the delay line with a frequency counter.

3. The method according to claim 2, wherein comparing the frequency of oscillation to a target frequency includes comparing an output of the frequency counter to a target frequency value.

4. The method according to claim 3, wherein adjusting the delay code includes monitoring for drift in delay and adjusting the delay code to correct drift.

5. The method according to claim 1, wherein adjusting the delay code includes monitoring for drift in delay and adjusting the delay code to correct drift.

6. The method according to claim 1, wherein adjusting the delay code includes:

placing the delay line in oscillator mode;

determining the frequency of oscillation of the delay line;

comparing the frequency of oscillation to the target frequency; and adjusting the delay code to correct drift.

7. The method according to claim 1, wherein. adjusting the delay code includes:

providing a replicate delay line;

placing the replicate delay line in oscillator mode;

determining frequency of oscillation of the replicate delay line;

comparing the frequency of oscillation of the replicate delay line to a scaled target frequency; and adjusting the delay code until the frequency of oscillation of the replicate delay line is substantially equal to the scaled target frequency.

8. A method of controlling delay in a signal delay line having an input and an output, wherein the signal delay line delays signals as a function of a delay code, the method comprising:

providing a replicate delay line having an input and an output, wherein the replicate delay line delays signals as a function of a delay code;

feeding the output of the signal delay line back to the input of the signal delay line to form an oscillator having an oscillation frequency;

determining the oscillation frequency of the signal delay line;

comparing the oscillation frequency of the signal delay line to a target frequency;

adjusting the delay code of the signal delay line until the frequency of oscillation of the signal delay line is substantially equal to the target frequency;

driving the replicate delay line with the delay code of the signal delay line;

feeding the output of the replicate delay line back to the input of the replicate delay line to form an oscillator having an oscillation frequency;

determining the oscillation frequency of the replicate delay line; and adjusting the delay code of the replicate and signal delay lines as a function of changes in the oscillation frequency of the replicate delay line.

9. The method according to claim 8, wherein determining the oscillation frequency of the signal delay line includes monitoring the signal delay line with a frequency counter.

10. The method according to claim 9, wherein comparing the oscillation frequency of the signal delay line to a target frequency includes comparing an output of the frequency counter to a target frequency value.

11. The method according to claim 8, wherein determining frequency of oscillation of the replicate delay line includes monitoring the replicate delay line with a frequency counter.

12. The method according to claim 11, wherein comparing the oscillation frequency of the replicate delay line to a target frequency includes comparing an output of the frequency counter to a target frequency value.

13. A delay line, comprising:

a master delay line, wherein the master delay line sets delay as a function of a delay code and wherein the master delay line includes an oscillator mode and wherein the master delay line has an oscillation frequency as a function of delay when in oscillator mode;

a slave delay line, wherein the slave delay line sets delay as a function of the delay code and wherein the slave delay line includes an oscillator mode and wherein the slave delay line has an oscillation frequency as a function of delay when in oscillator mode;

a delay line controller connected to the master delay line and the slave delay line, wherein the delay line controller includes a frequency counter and a state machine;

wherein the frequency counter determines the oscillation frequencies of the master and slave delay lines when the master and slave delay lines are in oscillator mode; and where delay code as a function of the oscillation frequencies of the master and slave delay lines.

* * * * *

UNITED STATES PATENT AND TRADEMARK OFFICE
CERTIFICATE OF CORRECTION

PATENT NO.    : 6,496,048 B1
DATED         : December 17, 2002
INVENTOR(S)   : Mark R. Sikkink It is certified that error appears in the above-identified patent and that said Letters Patent is hereby corrected as shown below:

<u>Title page,</u>
Item [74], after "*Attorney, Agent, or Firm*" insert -- , -- after "Kluth".

<u>Column 7,</u>
Line 31, delete "." after "wherein".

<u>Column 8,</u>
Line 51, delete "where" and insert -- wherein the state machine adjusts the -- therefor.

Signed and Sealed this

Seventh Day of October, 2003

JAMES E. ROGAN
*Director of the United States Patent and Trademark Office*